United States Patent [19]
Okawa et al.

[11] Patent Number: 5,396,862
[45] Date of Patent: Mar. 14, 1995

[54] METHOD OF MANUFACTURING A COMPOUND SEMICONDUCTOR

[75] Inventors: Kazuhiro Okawa, Hirakata; Shigeo Hayashi, Moriguchi; Takeshi Karasawa, Toyonaka; Tsuneo Mitsuyu, Hirakata, all of Japan

[73] Assignee: Matsushita Electric Industrial Co., Ltd., Kadoma, Japan

[21] Appl. No.: 151,894

[22] Filed: Nov. 15, 1993

[30] Foreign Application Priority Data

Nov. 16, 1992 [JP] Japan ................... 4-305220

[51] Int. Cl.$^6$ .................. H01L 21/20; H01L 21/306
[52] U.S. Cl. ........................ 117/90; 117/97; 117/106; 437/105; 156/643
[58] Field of Search ............... 437/105; 156/612, 643; 117/90, 97, 106

[56] References Cited

U.S. PATENT DOCUMENTS

| | | | |
|---|---|---|---|
| 4,477,311 | 10/1984 | Mimura et al. | 437/105 |
| 4,632,711 | 12/1986 | Fujita et al. | 437/105 |
| 5,133,830 | 7/1992 | Asaka | 156/643 |

FOREIGN PATENT DOCUMENTS 2-267938  11/1990  Japan .

OTHER PUBLICATIONS

M. Tonouchi, et al. "Reactive etching of polycrystalline CdS and ZnS films by electron cyclotron resonance hydrogen plasma" J. Appl. Phys 70 (6), 15 Sep. 1991 pp. 3367-3369.

K. Menda et al. "ZnSe Homo-Epitaxial Growth by Molecular Beam Epitaxy" J. Crystal Growth 86 (1988) pp. 342-347.

Primary Examiner—R. Bruce Breneman
Assistant Examiner—Linda J. Fleck
Attorney, Agent, or Firm—Fish & Richardson

[57] ABSTRACT

A compound semiconductor thin film is grown on a compound semiconductor surface, which is cleaned by irradiating the surface with gas containing at least hydrogen molecules and by efficiently removing contaminant on the surface at low temperature. A beam containing at least hydrogen molecules is irradiated from a plasma generating room attached to a MBE chamber, and cleans the surface of a compound semiconductor at low temperature. By an additional mechanism attached to the MBE chamber, a compound semiconductor thin film of high quality is grown on the cleaned surface of the compound semiconductor.

10 Claims, 3 Drawing Sheets

METHOD OF MANUFACTURING A COMPOUND SEMICONDUCTOR

FIELD OF THE INVENTION

The invention relates to a method of cleaning the surface of a compound semiconductor that comprises at least one element selected from the group consisting of Zn, Cd, Hg, Be, Mg, Ca, Sr and Mn as a bivalent element, and at least one element selected from the group consisting of S, Se, Te, Cr and Mo as a VI group element. The invention also relates to a method of growing and laminating a compound semiconductor thin film on a cleaned surface of the compound semiconductor.

BACKGROUND OF THE INVENTION

One example of a conventional method of cleaning the surface of a compound semiconductor and growing the compound semiconductor thin film is as follows:
preparing a ZnSe substrate;
placing the ZnSe substrate inside an apparatus, which is highly evacuated at $10^{-9}$ Torr; and
heating the substrate to 440°-650° C., thus removing contaminants from the surface of the substrate and then growing a ZnSe thin film on the substrate.

This method is mentioned, for example, in the Journal of Vacuum Science and Technology B, 9: 4 (1991), pp.1934–1938.

In this conventional method, however, the ZnSe thin film, grown on the substrate surface by a molecular beam epitaxy (MBE) method or a metal-organic chemical vapor deposition (MOCVD) method, is electrically and optically lowered although contaminant on the ZnSe substrate surface is removed by heating the surface at 440°-650° C. This is because the temperature (440°-650° C.) of the conventional method is higher than the growth temperature (about 150°-400° C.) of the ZnSe thin film grown by an MBE method or an MOCVD method.

A dry etching method of irradiating a hydrogen radical beam onto the surface of a compound semiconductor is disclosed in Japanese Published Patent Application No. Hei 2-267938 as a method of cleaning the compound semiconductor surface and growing the compound semiconductor thin film. However, in this method, the crystallinity of the compound semiconductor thin film regrown on the compound semiconductor is not substantial enough to be useful.

SUMMARY OF THE INVENTION

In order to solve the problems of the conventional methods, this invention provides a method of cleaning the surface of a compound semiconductor, such as ZnSe, without reducing the properties of the compound semiconductor. The invention also provides a method of growing a compound semiconductor thin film of high quality on the compound semiconductor surface.

In order to accomplish the above, the compound semiconductor is cleaned by irradiating the surface with a gas containing at least hydrogen molecules while the temperature of the compound semiconductor surface is kept below the growth temperature of the compound semiconductor.

It is preferable in this method that the temperature of the compound semiconductor surface is lower than 400° C.

It is further preferable in this method that the temperature of the compound semiconductor surface is 200°-360° C.

It is preferable in this method that the gas is a mixture of the hydrogen atoms and hydrogen molecules.

It is preferable in this method that the gas contains at least one gas selected from the group consisting of hydrogen gas, methane gas and ethylene gas and the gas is discharged in a vacuum vessel, thus generating plasma and that a molecular beam present in a part of the plasma generated in the vacuum vessel is irradiated onto the surface of the compound semiconductor.

It is also preferable in this method that the temperature of the gas is kept at 100°-700° C.

It is further preferable in this method that a compound semiconductor thin film is grown on the cleaned surface of the compound semiconductor.

It is preferable in this method that a means for cleaning the surface of the compound semiconductor and a means for growing the compound semiconductor thin film are connected in series.

It is also preferable in this method that a means for cleaning the surface of the compound semiconductor and a means for growing the compound semiconductor thin film are located in the same vessel.

It is further preferable in this method that the bivalent element is one element selected from the group consisting of Zn, Cd, Hg, Be, Mg, Ca, Sr, and Mn, and that the VI group element is at least one element selected from the group consisting of S, Se, Te, Cr, and It is preferable in this method that the compound semiconductor is at least one compound selected from the group consisting of ZnSe, $ZnS_YSe_{1-Y}$, $Zn_XMn_{1-X}S_YSe_{1-Y}$, $Zn_{1-X}Cd_XSe$, $Zn_XMg_{1-X}S_YSe_{1-Y}$, $Zn_XCd_{1-X}S_YSe_{1-Y}$, $Zn_XCa_{1-X}S_YSe_{1-Y}$, and $Zn_XBe_{1-X}S_YSe_{1-Y}$ (wherein $0<X<1$ and $0<Y<1$).

It is also preferable in this method that growing and laminating the compound semiconductor thin film on the compound semiconductor surface is carried out using at least one method selected from the group consisting of an MBE method and an MOCVD method.

DETAILED DESCRIPTION OF THE INVENTION

Figure 1:
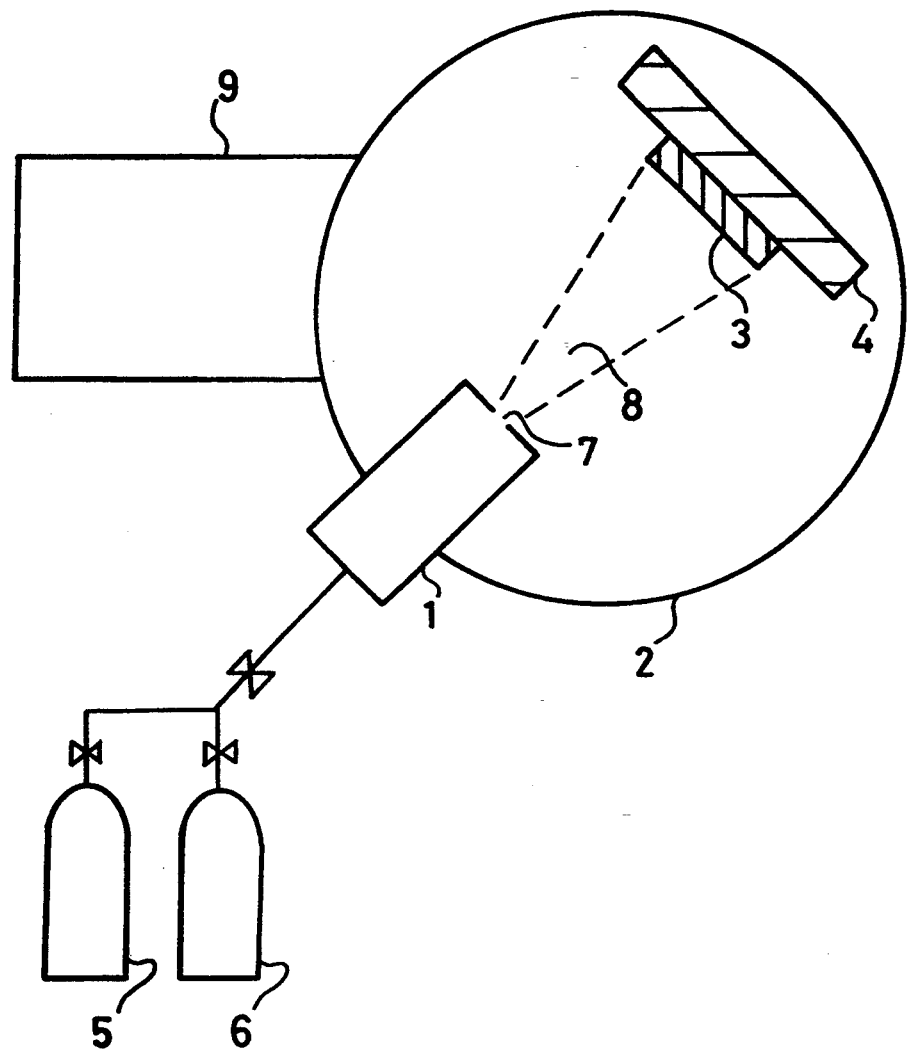
FIG. 1 shows a cross-sectional view of an MBE device comprising a plasma generating room of Example 1.

Based on its composition, the crystallinity of a compound semiconductor thin film is not damaged by irradiating the compound semiconductor surface with a gas containing at least hydrogen molecules since the temperature of the compound semiconductor surface is kept below the growth temperature of the compound semiconductor. As a result, the crystallinity of the compound semiconductor thin film becomes higher than the crystallinity of a compound semiconductor thin film regrown by conventional methods.

When hydrogen atoms (hydrogen radicals) are used for etching the compound semiconductor, the etching rate is expected to be high (about 1-10 nm/minute).

However, the crystallinity of the compound semiconductor thin film regrown on the compound semiconductor does not become significant enough probably because the energy of hydrogen atoms is so high that the crystal surface is damaged. The etching rate of hydrogen molecules is about one tenth the rate of hydrogen atoms. Therefore, it takes about one hour to clean the whole surface of the compound semiconductor with hydrogen molecules. However, the damage caused to the crystal surface is minimal in this case, and the crystallinity of the compound semiconductor thin film regrown by hydrogen molecules is higher than the crystallinity of the film regrown by hydrogen atoms. When the surface of the compound semiconductor is etched with a beam, which is a mixture of hydrogen atoms and molecules, the damage to the crystal surface is comparatively low enough to regrow a practical compound semiconductor thin film.

When the compound semiconductor is heated at a temperature higher than the growth temperature of the compound semiconductor (200°-360° C.), the property of the compound semiconductor is electrically and optically lowered. However, if the compound semiconductor is irradiated only for a short time, the temperature can be raised to about 400° C. Since the compound semiconductor is cleaned by a chemical reaction, the temperature of irradiating the compound semiconductor is preferably high (higher than 200° C.).

With such a composition, contaminants on the surface of the compound semiconductor can be efficiently removed at low temperature by irradiating the surface with gas comprising hydrogen molecules, thereby cleaning the compound semiconductor surface. More specifically, by such irradiation, contaminants on the surface are reduced or becomes hydrides, thereby subliming and then removing the contaminants. When the contaminant is an oxide, it can be reduced by hydrogen molecules, thus removing oxygen from the surface of the compound semiconductor. Alternatively, an oxide can be changed to a hydride by hydrogen molecules, thus subliming oxide from the surface of the compound semiconductor.

Plasma, which is generated by discharging gas containing at least one gas selected from the group consisting of hydrogen gas, methane gas and ethylene gas, comprises chemically active hydrogen molecules and the excited species and ions of hydrogen molecules; $CH_n$ (wherein n represents 0, 1, 2, 3 or 4) molecules and their excited species; and $C_2H_n$ (wherein n represents 0, 1, 2, 3, 4, 5 or 6) molecules and their excited species. Hydrogen molecules or the excited species and ions of hydrogen molecules have a strong reducing property, and can remove oxides on a substrate surface and etch the compound semiconductor. The degree of etching on the compound semiconductor can be controlled by shortening the time for irradiating the compound semiconductor with gas comprising hydrogen molecules.

For example, an apparatus comprises a vacuum vessel A in which at least one gas selected from the group consisting of hydrogen gas, methane gas and ethylene gas is contained and discharged, and a vacuum vessel B, equipped with an evacuation mechanism, in which the compound semiconductor is placed. The apparatus irradiates the surface of the compound semiconductor with a molecular beam comprised in part of plasma generated in the vacuum vessel A and introduced into the vacuum vessel B as the molecular beam, thus cleaning the surface of the compound semiconductor in the vacuum vessel B. By applying a vacuum deposition device and an MBE chamber as the vacuum vessel B, it is possible to laminate a material on the compound semiconductor surface which is cleaned by the irradiation treatment.

The surface of the compound semiconductor is preferably cleaned by irradiating hydrogen gas to the surface at 100°-700° C. The reduction of contaminants and the etching of the compound semiconductor can be promoted by irradiating hydrogen gas below 100° C. When the temperature of hydrogen gas is above 100° C., the reduction and etching by hydrogen gas can be significantly promoted. However, if the temperature is above 400° C., the property of the compound semiconductor will be reduced. In this sense, the temperature of hydrogen gas should be lower than 400° C., but the property of the compound semiconductor can still be retained even with a temperature around 700° C. as long as the pressure of hydrogen gas is below 100 Torr. The property of the compound semiconductor is retained even at a temperature higher than 700° C. by reducing the pressure of hydrogen gas. An MOCVD chamber equipped with an apparatus for cleaning a substrate surface can clean the compound semiconductor surface and laminate a material on the cleaned semiconductor surface.

EXAMPLES

Example 1

FIG. 1 shows a cross-sectional view of a molecular beam epitaxy (MBE) chamber 2 equipped with a plasma generating room 1. A sample 3 had a zinc magnesium sulfide selenide ($Zn_XMg_{1-X}S_YSe_{1-Y}$ wherein $0<X<1$ and $0<Y<1$: ZnMgSSe) thin film which was formed by an MBE method on the surface of a gallium arsenide (GaAs) substrate. After treating sample 3 in air, it was taken into MBE chamber 2, and attached to a substrate holder 4 equipped with a heater. MBE chamber 2 was evacuated until its inside pressure was below $10^{-8}$ Torr. Sample 3 was then heated by substrate holder 4 up to 300° C. The temperature to form a compound semiconductor thin film by an MBE method is below 400° C., more specifically in the range of 200°-360° C. Therefore, in order to keep the property of the compound semiconductor thin film, the temperature of sample 3 should be preferably below 400° C. However, when the compound semiconductor thin film is formed at a high temperature, the temperature for irradiating the thin film is not limited to below 400° C.

Mixed gas containing 95% by volume of hydrogen gas 5 and 5% by volume of ethylene gas 6 was introduced to plasma generating room 1. The pressure of the gas in plasma generating room 1 was about $10^{-3}$ Torr, and plasma was generated with about a 200 watt radio frequency. Plasma can be generated either by a method using dc voltage or a method using electron cyclotron resonance. Since the pressure of the gas inside MBE chamber 2 was lower than the pressure inside plasma generating room 1, a portion of plasma went through a hole 7 and irradiated sample 3 in MBE chamber 2. Due to the irradiation, oxide on the surface of ZnMgSSe thin film was removed, and the thin film itself was etched at the same time. In order to prevent the etching of the compound semiconductor, the level of etching can be controlled by shortening the time for irradiating with a beam 8. The cleaning effect as well as the etching effect provided to the compound semiconductor was significant by introducing only hydrogen gas into plasma generating room 1. In case of introducing only hydrogen gas to plasma generating room 1, the speed required for etching was less than half of the speed required for etching by introducing a mixed gas containing 5% by volume of ethylene gas.

When hydrogen atoms are used for etching the compound semiconductor, the crystallinity of the compound semiconductor thin film does not become significant enough. The speed required for etching the compound semiconductor by hydrogen molecules is much slower than the speed by hydrogen atoms, but the damage provided to the compound semiconductor by hydrogen molecules is much lower than the damage provided by hydrogen atoms. Therefore, when the compound semiconductor is etched with a gas mainly comprised of hydrogen molecules, the crystallinity of the compound semiconductor thin film becomes much higher than the thin film regrown by hydrogen atoms. If the compound semiconductor is etched with a beam, which is a mixture of hydrogen atoms and molecules, the damage to the compound semiconductor is comparatively low enough to regrow a practical compound semiconductor thin film with a fast etching rate.

The surface of sample 3 was observed by a reflection high-energy electron diffraction (RHEED) device attached to MBE chamber 2. Streaks of RHEED pattern were observed after the irradiation treatment even though such streaks were not found before the treatment. This observation indicates that oxides and contaminants on the sample surface were removed from the surface and that the surface was cleaned.

Bivalent elements and VI group elements were irradiated to the cleaned surface of sample 3 from many crucibles, which were provided to MBE chamber 2, thus laminating a ZnSe thin film, a $ZnS_XSe_{1-X}$ thin film (wherein $0<X<1$: ZnSSe thin film), a ZnMgSSe thin film or a $Zn_{1-X}Cd_XSe$ thin film (wherein $0<X<1$). Since the MBE chamber of FIG. 1 can clean a substrate surface and form a thin film at the same time in the same vacuum vessel, sample 3 does not have to be exposed to air, thus forming a compound semiconductor thin film of high quality on the cleaned surface of sample 3.

The effect of the example is unchanged even if ethylene gas 4 is replaced with methane gas.

A material, comprising at least one bivalent element selected from the group consisting of Zn, Cd, Hg, Be, Mg, Ca, Sr and Mn and at least one VI group element selected from the group consisting of S, Se, Te, Cr and Mo (for example, ZnSe, $ZnS_YSe_{1-Y}$, $Zn_XMn_{1-X}S_YSe_{1-Y}$, $Zn_{1-X}Cd_XSe$, $Zn_XMg_{1-X}S_YSe_{1-Y}$, $Zn_XCd_{1-X}S_YSe_{1-Y}$, $Zn_XCa_{1-X}S_YSe_{1-Y}$, $Zn_XBe_{1-X}S_YSe_{1-Y}$ (wherein $0<X<1$ and $0<Y<1$)) is used as a compound semiconductor in the invention.

Example 2

Figure 2:
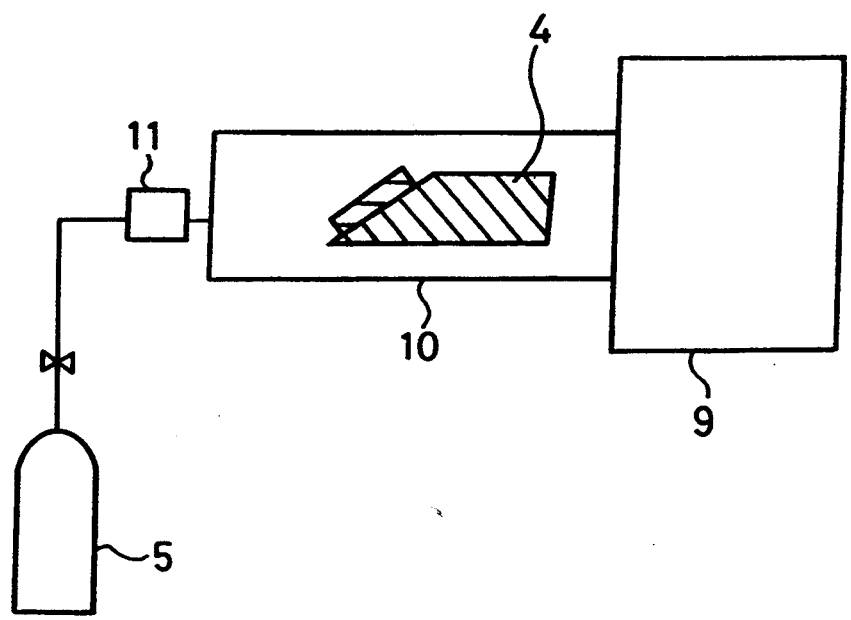
FIG. 2 shows a cross-sectional view of an MOCVD device comprising a mechanism for heating hydrogen gas of Example 2.

This example is described in detail below with reference to FIG. 2.

Sample 3 had a ZnMgSSe thin film, formed by an MBE method, on the surface of a GaAs substrate. After treating sample 3 in air, it was put into a metal-organic chemical vapor deposition (MOCVD) chamber 10, and placed on a substrate holder 4 equipped with a heater. After evacuating the pressure inside MOCVD chamber 10 below $10^{-6}$ Torr, sample 3 was heated by substrate holder 4 up to 300° C. The growth temperature of a compound semiconductor thin film by an MBE method should be below 400° C., more specifically in the range of 200°–360° C. Therefore, in order to keep the property of the compound semiconductor thin film, the growth temperature of sample 3 should be preferably below 400° C. However, when the compound semiconductor thin film is grown at a high temperature, the growth temperature is not limited to below 400° C.

By passing hydrogen gas 5 through a heat source 11, the temperature of hydrogen gas 5 introduced to MOCVD chamber 10 became about 360° C. The pressure of the gas inside MOCVD chamber 10 was set at around 70 Torr, hydrogen gas 5 was set at about 400° C. and sample 3 was irradiated. As a result, oxide on the surface of the ZnMgSSe thin film was removed. More specifically, oxide on the surface was reduced or sublimed by hydrogen gas, thus cleaning the surface of the compound semiconductor.

The reduction of contaminants and the etching of the surface by hydrogen gas can be effectively promoted below 100° C. However, in order to remove oxide and contaminant in a short time, the temperature of hydrogen gas is preferably above 100° C. A method of heating hydrogen gas and a method of raising the temperature of substrate holder 4 are both applicable as methods of raising the temperature of hydrogen gas. However, if the temperature of hydrogen gas is above 400° C., the temperature of the compound semiconductor surface will be higher than the growth temperature of the compound semiconductor, thus lowering the properties of the compound semiconductor. In this sense, the temperature of hydrogen gas is preferably below 400° C. However, by reducing the pressure of hydrogen gas, the temperature of sample 3 was kept below 400° C. while the temperature of hydrogen gas was about 700° C. The pressure of hydrogen gas inside MOCVD chamber 10 is dependent on the temperature of that gas, and the pressure has to be lowered when the gas is at high temperature. For instance, when the temperature of hydrogen gas was at 700° C., the pressure of the gas inside MOCVD chamber 10 had to be about $10^{-2}$ Torr to provide a significant irradiation treatment to sample 3.

Gas containing bivalent elements and VI group elements irradiated the cleaned surface of sample 3 through a gas channel of MOCVD chamber 10, thus laminating a ZnSe thin film, a ZnSSe thin film, a ZnMgSSe thin film or a $Zn_{1-X}Cd_XSe$ thin film (wherein $0<X<1$). Since the MOCVD chamber of FIG. 2 can clean a substrate surface and form a thin film at the same time in the same vacuum vessel, sample 3 does not have to be exposed to air, thus forming a compound semiconductor thin film of high quality on the cleaned surface of sample 3.

A material, comprising at least one bivalent element selected from the group consisting of Zn, Cd, Hg, Be, Mg, Ca, Sr and Mn and at least one VI group element selected from the group consisting of S, Se, Te, Cr and Mo (for example, ZnSe, $ZnS_YSe_{1-Y}$, $Zn_XMn_{1-X}S_YSe_{1-Y}$, $Zn_{1-X}Cd_XSe$, $Zn_XMg_{1-X}S_YSe_{1-Y}$, $Zn_XCd_{1-X}S_YSe_{1-Y}$, $Zn_XCa_{1-X}S_YSe_{1-Y}$, $Zn_XBe_{1-X}S_YSe_{1-Y}$ (wherein $0<X<1$ and $0<Y<1$)) can be used as a compound semiconductor in the invention.

Figure 3:
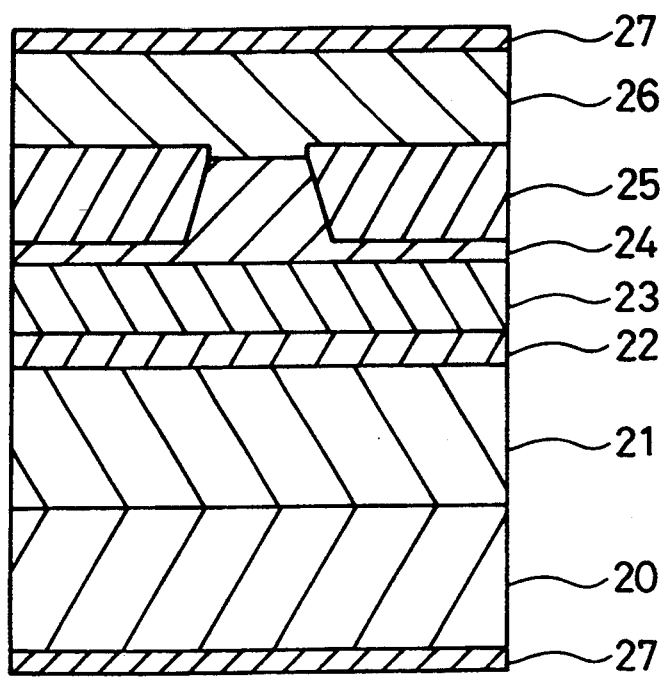
FIG. 3 shows a cross-sectional schematic illustration of a buried-ridge semiconductor laser device using a compound semiconductor of one embodiment.

According to the examples of the invention mentioned above, it is possible to clean the compound semiconductor surface by removing contaminants such as oxides on the surface without reducing the property of the compound semiconductor manufactured by the MBE method or the MOCVD method. In this invention, it is also possible to form a compound semiconductor thin film on the cleaned surface of the compound semiconductor. Due to this invention, moreover, a buried-ridge semiconductor laser device using the compound semiconductor of FIG. 3 can be manufactured. In FIG. 3, numeral 20 indicates an n-type GaAs substrate; numeral 21 indicates an n-type ZnMgSSe layer; 22 indicates a ZnSe layer; 23 indicates a p-type ZnMgSSe layer; 24 indicates a p-type ZnSSe layer; 25 indicates a n-type ZnSe layer; 26 indicates a p-type ZnSSe layer; and 27 indicates an electrode. The mesa of a mixed crystal p-type ZnSSe layer 24 was formed by treating the layer with a chemical etchant in air. The substrate of FIG. 3 was then placed in MBE chamber 2 equipped with a device for treating the layer surface. By treating the surface of the layer in MBE chamber 2, a single crystal n-type ZnSe layer 25, which was highly crystallized, was formed. The n-type ZnSe layer formed on the surface of the mesa of the p-type ZnSSe layer 24 was removed by a chemical etchant, and the surface of the substrate of FIG. 3 was again treated in MBE chamber 2, thus forming a p-type ZnSSe layer 26 of FIG. 3 of high quality. P-type ZnSSe layer 26 can be formed in the processes mentioned above not only by MBE chamber 2 but also by MOCV chamber 10. N-type ZnSe layer 25 and p-type ZnSSe layer 26 formed without the surface irradiation treatments of the invention mentioned above had a poor crystallization property. In other words, a buried-ridge semiconductor laser device using a compound semiconductor of the invention lasted longer than the device having a compound semiconductor with no surface irradiation treatment.

In this invention, contaminants on a compound semiconductor surface can be removed by irradiating the surface with gas containing at least hydrogen molecules, thus efficiently cleaning the surface at low temperature. By attaching a means for generating plasma and a beam containing at least hydrogen molecules (processing device) to an MBE chamber, MOCVD chamber and the like, a compound semiconductor thin film of high quality can be formed efficiently on the cleaned surface of the compound semiconductor in the invention.

The invention may be embodied in other specific forms without departing from the spirit or essential characteristics thereof. The embodiments disclosed in this application are to be considered in all respects as illustrative and not restrictive, the scope of the invention being indicated by the appended claims rather than by the foregoing description, and all changes which come within the meaning and range of equivalency of the claims are intended to be embraced therein.

We claim:

1. A method of cleaning a compound semiconductor comprising irradiating a surface of a compound semiconductor containing at least one bivalent element and at least one VI group element with a gas containing hydrogen gas and at least one gas selected from the group consisting of methane gas and ethylene gas while maintaining the temperature of the compound semiconductor surface below a growth temperature of said compound semiconductor and between 200° C. and 360° C.

2. A method according to claim 1, wherein said gas is discharged in a vacuum vessel, thus generating plasma, and wherein a molecular beam comprised in part of said plasma generated in said vacuum vessel is irradiated to the surface of said compound semiconductor.

3. A method according to claim 2, wherein said gas is kept at a temperature between 100° C. and 700° C.

4. A method according to claim 3, wherein said gas is kept at a pressure below atmospheric pressure.

5. A method for manufacturing a compound semiconductor comprising the steps of:
cleaning a surface of a compound semiconductor containing at least one bivalent element and at least one VI group element by irradiating said surface with a gas containing hydrogen gas and at least one gas selected from the group consisting of methane gas and ethylene gas while maintaining the temperature of the compound semiconductor surface below a growth temperature of said compound semiconductor and between 200° and 360° C.; and
growing and laminating the compound semiconductor on the cleaned surface.

6. A method according to claim 5, wherein a means for cleaning the surface of said compound semiconductor and a means for growing a compound semiconductor thin film are connected in series.

7. A method according to claim 5, wherein the cleaning the surface of said compound semiconductor and the growing the compound semiconductor are carried out in the same vessel.

8. A method according to claim 1, wherein the bivalent element is at least one element selected from the group consisting of Zn, Cd, Hg, Be, Mg, Ca, Sr, and Mn, and wherein the VI group element is at least one element selected from the group consisting of S, Se, Te, Cr, and Mo.

9. A method according to claim 1, wherein said compound semiconductor is at least one compound selected from the group consisting of ZnSe, $ZnS_YSe_{1-Y}$, $Zn_XMn_{1-X}S_YSe_{1-Y}$, $Zn_{1-X}Cd_XSe$, $Zn_XMg_{1-X}S_YSe_{1-Y}$, $Zn_XCd_{1-X}S_YSe_{1-Y}$, $Zn_XCa_{1-X}S_YSe_{1-Y}$, and $Zn_XBe_{1-X}S_YSe_{1-Y}$, and wherein $0<X<1$ and $0<Y<1$.

10. A method according to claim 5, the growing and laminating the compound semiconductor on the cleaned surface is carried out with at least one method selected from the group consisting of a molecular beam epitaxy method and a metal-organic chemical vapor deposition method.

* * * * *